United States Patent
Matsumura et al.

(10) Patent No.: US 7,334,210 B2
(45) Date of Patent: Feb. 19, 2008

(54) SEMICONDUCTOR INTEGRATED CIRCUIT AND METHOD OF DESIGNING THE SAME

(75) Inventors: Yoichi Matsumura, Takatsuki (JP); Takako Ohashi, Otsu (JP); Katsuya Fujimura, Kameoka (JP); Chihiro Itoh, Nagaokakyo (JP); Hiroki Taniguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 221 days.

(21) Appl. No.: 10/980,269

(22) Filed: Nov. 4, 2004

(65) Prior Publication Data

US 2005/0097492 A1    May 5, 2005

(30) Foreign Application Priority Data

Nov. 4, 2003  (JP)  .............................. 2003-374695

(51) Int. Cl.
*G06F 17/50* (2006.01)
(52) U.S. Cl. .............................................. 716/17; 17/1
(58) Field of Classification Search .................... 716/1, 716/16–18
See application file for complete search history.

(56) References Cited

U.S. PATENT DOCUMENTS

| | | | |
|---|---|---|---|
| 5,223,733 A | | 6/1993 | Doi et al. |
| 5,966,522 A * | | 10/1999 | Bjorksten et al. ............. 716/13 |
| 6,327,694 B1 * | | 12/2001 | Kanazawa ..................... 716/7 |
| 6,519,750 B2 * | | 2/2003 | Yamashita .................... 716/10 |
| 6,732,335 B2 * | | 5/2004 | Takabayashi et al. .......... 716/1 |
| 6,763,506 B1 * | | 7/2004 | Betz et al. ..................... 716/6 |
| 2003/0023938 A1 * | | 1/2003 | Nagasaka et al. ............. 716/2 |
| 2004/0031007 A1 * | | 2/2004 | Hirakimoto et al. ........... 716/8 |

FOREIGN PATENT DOCUMENTS

| | | |
|---|---|---|
| EP | 1 083 598 A1 | 3/2001 |
| JP | 02-121349 | 5/1990 |
| JP | 6-260555 A | 9/1994 |
| JP | 7-14927 | 1/1995 |
| JP | 11-186497 | 7/1999 |
| JP | 11-204649 | 7/1999 |
| JP | 11-251439 | 9/1999 |
| JP | 2000-277618 | 10/2000 |
| JP | 2000-357741 | 12/2000 |
| JP | 2002-110802 | 4/2002 |
| JP | 2002-217300 | 8/2002 |

OTHER PUBLICATIONS

Japanese Office Action, issued in corresponding Japanese Patent Application No. 2003-374695 dated on Oct. 12, 2007.

* cited by examiner

*Primary Examiner*—Jack Chiang
*Assistant Examiner*—Binh Tat
(74) *Attorney, Agent, or Firm*—McDermott Will & Emery LLP

(57) ABSTRACT

In a semiconductor integrated circuit, since resistance component is included in a power-supply wiring, a power-supply voltage supplied to a cell on a clock path is dropped to cause a clock skew. To avoid this problem, a cell-placement prohibiting area is set centering on a cell 10 on the clock path, and no cell for performing a logical operation is placed in this cell-placement prohibiting area. Also, a cell-placement prohibiting area may be set for each of cell groups formed of a plurality of cells closely placed together. Furthermore, a capacitive cell may be placed in the cell-placement prohibiting area.

6 Claims, 11 Drawing Sheets

Fig. 6
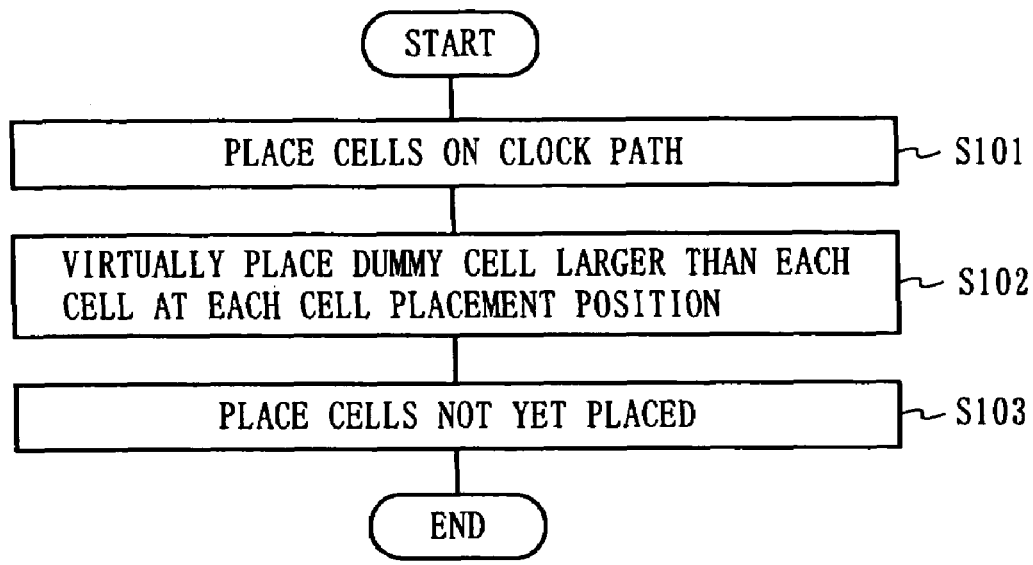
Fig. 7A  Fig. 7B  Fig. 7C
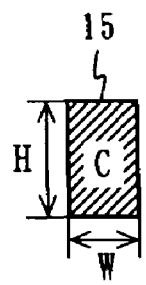
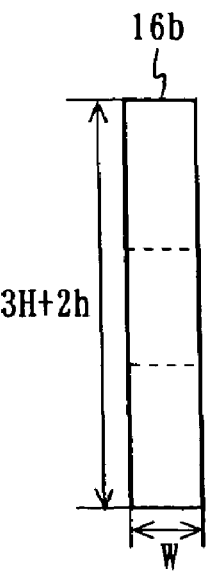
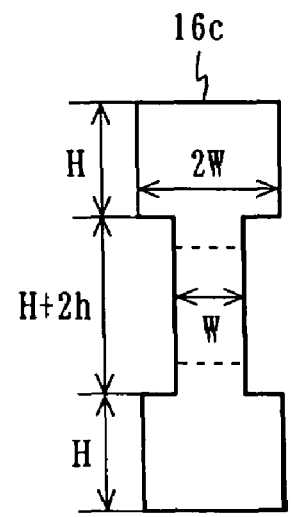

Fig. 12A
Fig. 12B
Fig. 12C
Fig. 12D
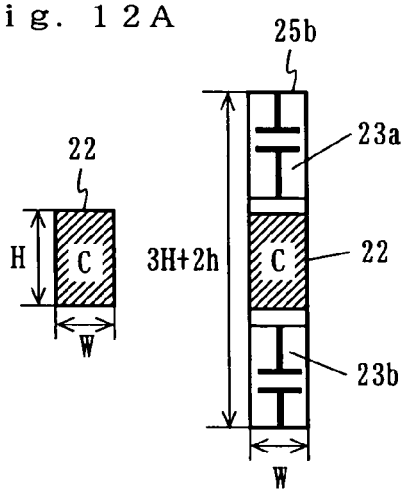
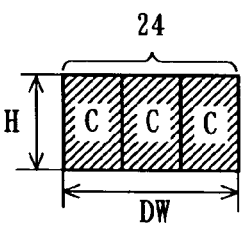
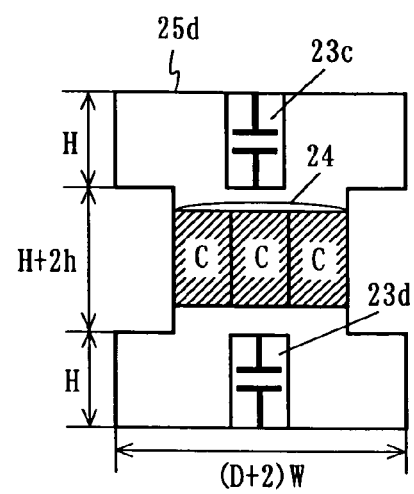
Fig. 13
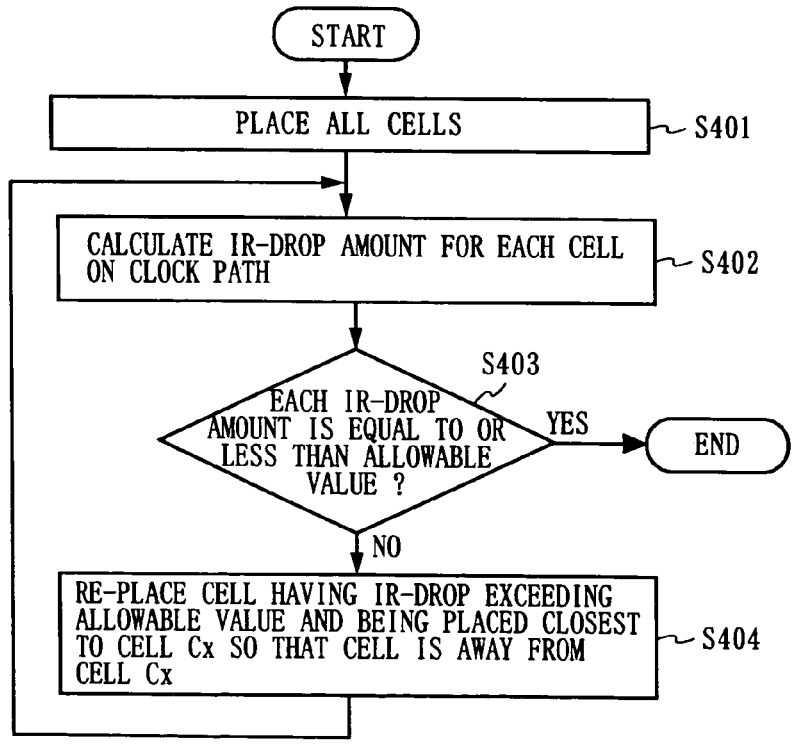

SEMICONDUCTOR INTEGRATED CIRCUIT AND METHOD OF DESIGNING THE SAME

BACKGROUND OF THE INVENTION

1. Field of the Invention

The present invention relates to a semiconductor integrated circuit and a method of designing a semiconductor integrated circuit. More particularly, the present invention relates to a semiconductor integrated circuit designed in consideration of an IR-drop on a power-supply wiring, and a method of designing such a semiconductor integrated circuit.

2. Description of the Background Art

A large majority of semiconductor integrated circuits operate in synchronization with a clock signal externally supplied or internally generated based on an externally-supplied signal. In general, a semiconductor integrated circuit includes a plurality of flip-flops and a circuit for generating a clock signal to be supplied to each flip-flop based on a clock signal (hereinafter referred to as a clock circuit). To cause the semiconductor integrated circuit to operate accurately, it is required that the clock signal is accurately supplied to each flip-flop. Also, to reduce power consumption of the semiconductor integrated circuit, it is effective to stop supplying the clock signal to circuit blocks that are not caused to operate. For this reason, the structure of a clock circuit and the method of supplying the clock signal are recognized as being important issues in designing a semiconductor integrated circuit.

To design a logic circuit, a cell-based designing scheme is widely used, in which rectangular cells corresponding to logical elements are placed in a two-dimensional area. Particularly in the cell-based designing scheme, for the purpose of facilitating cell placement, cells having the same height (standard cells) are often used. FIG. 19 is an illustration showing layout results of a conventional semiconductor integrated circuit. In FIG. 19, rectangular areas provided with characters C each represent a single cell (standard cell). These cells are placed within a plurality of strip areas 91 provided in parallel with each other in the two-dimensional area so as to be aligned at top. Between two strip areas 91, a power-supply wiring 92 is provided for supplying power to each cell. The power-supply wiring 92 includes a power-supply wiring 92a applied with a power-supply voltage VDD and a power-supply wiring 92b applied with a ground voltage VSS. These two types of power-supply wirings 92a and 92b are alternately placed in the two-dimensional area where the strip areas 91 are arranged.

In semiconductor integrated circuits of recent years, a phenomenon called an IR-drop is particularly a problem. A power-supply wiring includes a resistance component. Therefore, when power is supplied to each cell via such a power-supply wiring, a voltage at each cell is lower than a voltage supplied from the outside of the semiconductor integrated circuit. FIG. 20 is an illustration showing a state where an IR-drop occurs. FIG. 20 shows a distribution of power-supply voltages at the respective cells included in the semiconductor integrated circuit 93 when a power-supply voltage of 3.0V is supplied via a power-supply terminal 94 to the semiconductor integrated circuit 93. Since a resistance component 96 is included in a power-supply wiring 95, even through a power-supply voltage of 3.0V is supplied from the power-supply terminal 94, a voltage at each cell included in the semiconductor integrated circuit 93 is lower than 3.0V. For example, a power-supply voltage at a cell 97 is approximately 2.7V.

The reason for such occurrence of an IR-drop is as follows. When a cell is operated to cause changes in value of an output signal from the cell, a current flows from the power-supply wiring through a terminal of a transistor included in the cell. With this, the voltage supplied from the outside of the semiconductor integrated circuit is decreased at the time of reaching the cell by an amount equivalent to the product of the flowing current and the resistance component of the power-supply wiring. Particularly when an IR-drop occurs in a power-supply voltage supplied to a cell on a clock path, a delay time at the time of a real operation of the cell on the clock path becomes different from a delay time without occurrence of an IR-drop, thereby causing a clock skew more than assumed at the time of designing the circuit. Such a clock skew may cause a malfunction of the circuit.

As schemes of placing cells included in a semiconductor integrated circuit and measures for coping with an IR-drop, various technologies are conventionally known. Of these, examples of technologies associated with the present invention are disclosed in the following documents. Japanese Patent Laid-Open Publication No. 7-14927 discloses an automatic placement designing method and apparatus in which timing analysis is performed after placement and routing and, if timing restrictions are not satisfied, a delay cell is automatically inserted, replaced, or deleted. Japanese Patent Laid-Open Publication No. 11-251439 discloses a method in which a clock buffer for supplying a clock signal to a plurality of cells is placed at a position closer to a power-supply wiring than any of the plurality of cells. Japanese Patent Laid-Open Publication No. 2002-110802 discloses a layout apparatus and method in which timing analysis and voltage-drop analysis are performed after placement and routing and, if a voltage drop is present, an additional power-supply wiring is routed between a voltage-supply I/O and an anti-voltage-drop element that is placed together with logical elements.

However, in the semiconductor integrated circuits of recent years, with the progress of microfabrication, the width of the power-supply wiring is reduced, thereby increasing a resistance per unit length of the power-supply wiring. Therefore, an IR-drop is more prone to occur. Moreover, with an increase in circuit size and a reduction in voltage, a clock skew is also more prone to occur. Therefore, in the semiconductor integrated circuits of recent years, it is required at a level higher than ever before to suppress the occurrence of a clock skew due to an IR-drop.

SUMMARY OF THE INVENTION

Therefore, an object of the present invention is to provide a semiconductor integrated circuit with the occurrence of a clock skew due to an IR-drop being suppressed, and a method of designing such a semiconductor integrated circuit.

In order to achieve the object mentioned above, the present invention has the following features.

A first aspect of the present invention is directed to a semiconductor integrated circuit including: a plurality of cells placed so as to be aligned at top in a plurality of strip areas provided in parallel with each other; and a plurality of wirings connecting among the cells, wherein the cells include cells on a clock path and a cell for performing a logical operation, and a cell-placement prohibiting area is set for each of all or part of the cells on the clock path so as to center on the cell on the clock path, and the cell for performing the logical operation is placed in a portion of the strip areas except the cell-placement prohibiting areas.

In this case, a cell-placement prohibiting area placed so as to center on a cell in a strip area may overlap with strip areas immediately above and below the strip area by a width not shorter than a width of each cell or by a width not shorter than three times as long as a width of the cell.

Also, cell groups each formed of a plurality of cells closely placed together in a single strip area may include cell groups on the clock path, and a cell-placement prohibiting area may be set for all or part of the cell groups on the clock path.

Furthermore, a capacitive cell may be placed in at least one of the cell-placement prohibiting areas. More preferably, a cell-placement prohibiting area placed so as to center on a cell in a strip area may form an overlapping area with strip areas immediately above and below the strip area, and the capacitive cell may be placed in the overlapping area.

A second aspect of the present invention is directed to a method of designing a semiconductor integrated circuit including the steps of: placing all or part of cells on a clock path; virtually placing, at a position of each cell, a dummy cell which is larger than each cell; and placing not-yet-placed cells in a portion of the strip areas except areas where the dummy cells are placed.

A third aspect of the present invention is directed to a method of designing a semiconductor integrated circuit including the steps of: placing cells; placing, for each of all or part of cells on a clock path, a cell-placement prohibiting area larger than each cell, at a position of each cell; and re-placing a cell for performing a logical operation placed in the cell-placement prohibiting area so as to be placed in a portion of the strip areas except the cell-placement prohibiting areas.

A fourth aspect of the present invention is directed to a method of designing a semiconductor integrated circuit including the steps of: generating, for each of all or part of cells on a clock path, a composite cell including the cell and the capacitive cell; placing the generated composite cells; and placing not-yet-placed cells in a portion of the strip areas except an area where the composite cell is placed.

In the second through fourth aspects, cell groups each formed of a plurality of cells closely placed together in a single strip area may be regarded as a single cell.

A fifth aspect of the present invention is directed to a method of designing a semiconductor integrated circuit including the steps of: placing cells; calculating, for each of all or part of cells on a clock path, a degree of drop in a power-supply voltage at each cell occurring due to resistance of a power-supply wiring; and re-placing a cell on a clock path whose degree calculated in the degree calculating step does not satisfy a predetermined reference so that a cell near the cell on the clock path is away from the cell on the clock path.

A sixth aspect of the present invention is directed to a semiconductor integrated circuit including: a plurality of cells; a first power-supply wiring for supplying power to all or part of cells on a clock path; and a second power-supply wiring for supplying power to remaining cells among the plurality of cells, wherein the first power-supply wiring is provided separately from the second power-supply wiring.

A seventh aspect of the present invention is directed to a semiconductor integrated circuit including: a plurality of cells; a power-supply wiring for supplying power to the cells; an additional power-supply wiring applied with a voltage higher than a voltage of the power-supply wiring; and a voltage converting section for dropping the voltage on the additional power-supply wiring to a power-supply voltage to be supplied to the plurality of cells and applying the dropped voltage to the power-supply wiring. In this case, the voltage converting section includes a power transistor, for example.

According to the first aspect, a cell for performing a logical operation is not placed near any cell on the clock path. Therefore, a point at which a cell on the clock path is connected to the power-supply wiring is a predetermined distance away from a point at which a cell for performing a logical operation is connected to the power-supply wiring. Therefore, the cell on the clock path is insusceptible to the influence of an IR-drop occurring when the cell for performing the logical operation is operated. Thus, it is possible to prevent an inconvenience such that the power-supply voltage at the cell on the clock path is dropped when another cell is operated and this drop causes a clock skew to result in a circuit malfunction.

With a capacitive cell being provided, the power supplied via the power-supply wiring can be stabilized. Therefore, the above inconvenience can be more effectively prevented.

According to the second through fourth aspect, it is possible to design a semiconductor integrated circuit having a feature in which no cell for performing a logical operation is placed near any cell on the clock path. Also, for the cells on the clock path as a unit, it is possible to place a dummy cell, set a cell-placement prohibiting area, place a capacitive cell, etc. Therefore, the process can be simplified.

According to the fifth aspect, it is possible to design a semiconductor integrated circuit with the occurrence of a clock skew due to an IR-drop being suppressed without moving a cell on the clock path.

According to the sixth aspect, even if a cell other than the cells on the clock path is operated, such an operation does not influence the power-supply wirings for supplying power to the cells on the clock path. Thus, the occurrence of a clock skew due to an IR-drop can be suppressed.

According to the seventh aspect, the IR-drop occurring at the center of the chip can be effectively suppressed. Accordingly, the occurrence of a clock skew due to the IR-drop can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a flowchart showing a first method of designing the semiconductor integrated circuit according to the first embodiment of the present invention;

FIGS. 7A through 7C are illustrations each showing a dummy cell for use in the first method of designing the semiconductor integrated circuit according to the first embodiment of the present invention;

FIGS. 12A through 12D are illustrations each showing a composite cell for use in the method of designing the semiconductor integrated circuit according to the second embodiment of the present invention;

FIG. 13 is a flowchart showing a method of designing the semiconductor integrated circuit according to a third embodiment of the present invention;

DESCRIPTION OF THE PREFERRED EMBODIMENTS

First Embodiment

Figure 1:
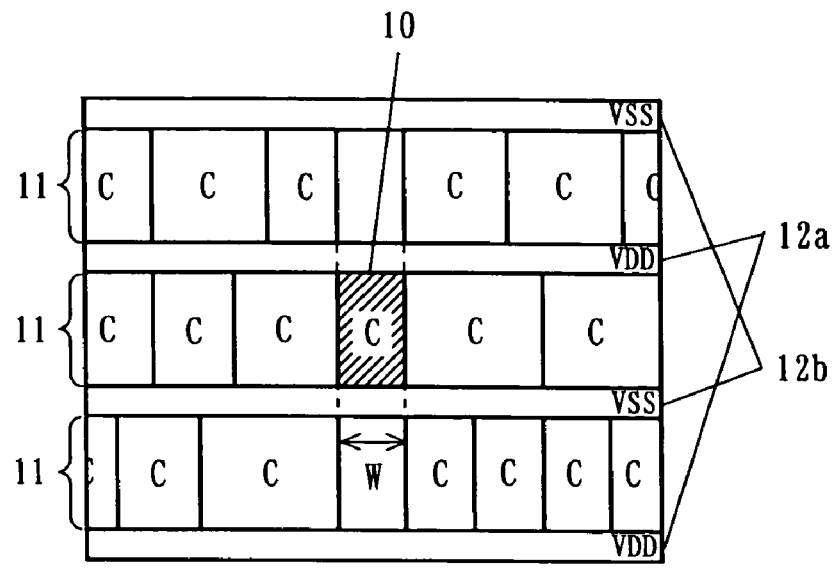
FIG. 1 is an illustration showing layout results of a semiconductor integrated circuit according to a first embodiment of the present invention.

In a first embodiment of the present invention, described are a semiconductor integrated circuit with the occurrence of a clock skew due to an IR-drop being suppressed and a method of designing such a semiconductor integrated circuit. FIG. 1 is an illustration showing layout results of the semiconductor integrated circuit according to the present embodiment. The semiconductor integrated circuit shown in FIG. 1 includes a plurality of cells (rectangular areas with characters C) and wirings connecting among the cells. Note that, in FIG. 1 and other drawings, a hatched cell represents a cell on a clock path. Also, for simplification of the drawings, wirings connecting among the cells may be omitted where appropriate.

The cells shown in FIG. 1 are standard cells having the same height, and are placed within a plurality of strip areas 11 provided in parallel with each other in a two-dimensional area so as to be aligned at top. Power-supply wirings 12 include power-supply wiring 12a applied with a power-supply voltage VDD and power-supply wiring 12b applied with a ground voltage VSS. These two types of the power-supply wirings 12a and 12b are alternately placed in the two-dimensional area where the strip areas 11 are arranged. Here, in order to reduce the chip size of the semiconductor integrated circuit for reduction in manufacturing cost, the cells are preferably placed with a minimum gap therebetween. However, depending on the state of wirings connecting among the cells, there may be some gap among the cells.

The semiconductor integrated circuit shown in FIG. 1 has a feature in which an area where a cell for performing a logical operation cannot be placed (hereinafter referred to as a cell-placement prohibiting area) is set for all or part of the cells on the clock path so as to center on the relevant cell. The cells for performing a logical operation are placed in an area other than the cell-placement prohibiting area in the strip areas 11.

Hereinafter, the case where a cell-placement prohibiting area is set for a cell 10 placed on a clock path in an n-th (n is an integer, which also applies to the following description) strip area 11 is described. The cell 10 is a cell of an arbitrary type on the clock path. In general, the cell on the clock path is required to be more insusceptible to the influence of an IR-drop than other cells. Therefore, in the semiconductor integrated circuit according to the present embodiment, a cell for performing a logical operation is prohibited from being placed in the cell-placement prohibiting area centering on the cell 10.

For example, in the semiconductor integrated circuit shown in FIG. 1, a combination of the following areas is set as a cell-placement prohibiting area for the cell 10:

(1) a first rectangular area occupied by the cell 10;

(2) a second rectangular area occupied by the cell 10 after being moved in parallel with a cell's height direction to an (n−1)-th strip area;

(3) a third rectangular area occupied by the cell 10 after being moved in parallel with a cell's height direction to an (n+1)-th strip area;

(4) a fourth rectangular area between the first and second rectangular areas; and (5) a fifth rectangular area between the first and third rectangular areas. Therefore, in this semiconductor integrated circuit, no cell for performing a logical operation is placed in the second and third rectangular areas. This is apparently shown in FIG. 1 such that no cell for performing a logical operation is placed immediately above or below the cell 10.

Figures 2A, 2B:
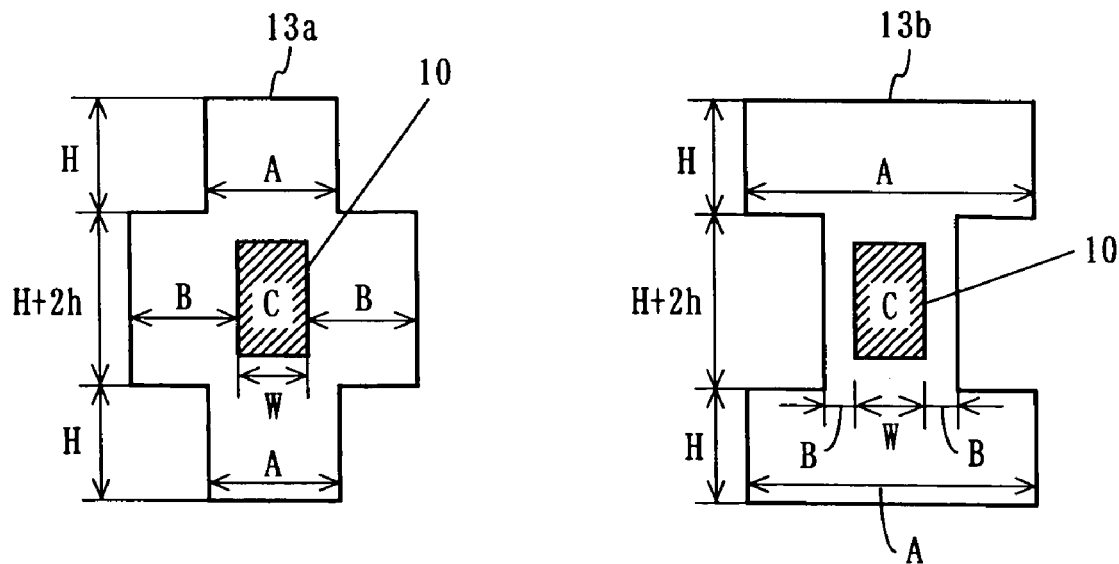
FIGS. 2A and 2B are illustrations each showing cell-placement prohibiting area in the semiconductor integrated circuit according to the first embodiment of the present invention.

In addition to the scheme shown in FIG. 1, various schemes of setting a cell-placement prohibiting area can be thought. When the height of the cell 10 is H, the width thereof is W, and the width of the power-supply wiring is h, the cell-placement prohibiting areas 13 as shown in FIGS. 2A and 2B can be set for the cell 10, for example. In this case, widths A and B shown in FIGS. 2A and 2B are determined so as to have each appropriate value. The cell-placement prohibiting area 13 is a combination of the following:

(1) a first rectangular area having a height of H and a width of (W+2B) centering on the cell 10 in an n-th strip area;

(2) a second rectangular area having a height of H and a width of A located at the same cell-width position as that of the cell 10 in an (n−1)-th strip area;

(3) a third rectangular area having a height of H and a width of A located at the same cell-width position as that of the cell 10 in an (n+1)-th strip area;

(4) a fourth rectangular area having a height of h and a width of (W+2B) between the first and second rectangular areas; and (5) a fifth rectangular area having a height of h and a width of (W+2B) between the first and third rectangular areas. Here, no cell can be placed in an area where any power-supply wiring 12 is placed. Therefore, the fourth and fifth rectangular areas may not be included in the cell-placement prohibiting area 13 and, even if they are included, the width may be arbitrary (for example, the width may be A).

The width A and B are determined so that at least one of the widths is a positive number. When the width A is shorter than a width of (W+2B), the cell-placement prohibiting area 13 has a cross shape (an area 13a) as shown in FIG. 2A. When the width A is longer than the width of (W+2B), the cell-placement prohibiting area 13 has an H shape (an area 13b) as shown in FIG. 2B. When the width A is equal to or longer than the width W of the cell 10, the cell-placement prohibiting area 13 overlaps with the (n−1)-th and (n+1)-th strip areas 11 so as to have a width equal to or longer than the width of the cell 10. Also, when the width B is equal to or longer than the width W of the cell 10, the cell-placement prohibiting area 13 overlaps with the n-th strip area 11 by a width not shorter than three times as long as the width of the cell 10.

Figure 3A:
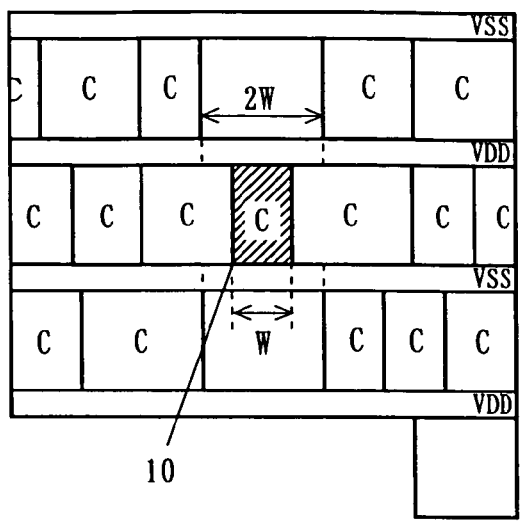
FIGS. 3A through 3C are illustrations showing other layout results of the semiconductor integrated circuit according to the first embodiment of the present invention.
Figure 3B:
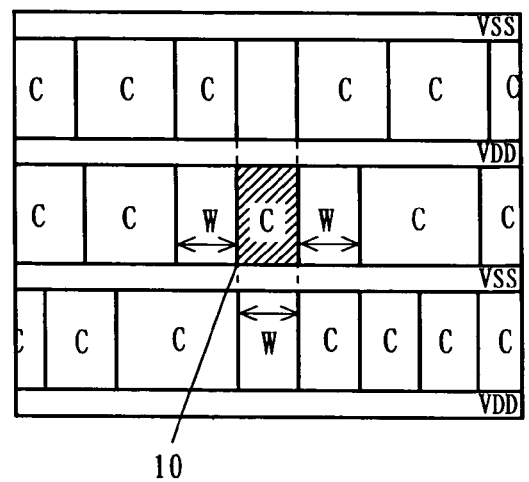
Figure 3C:
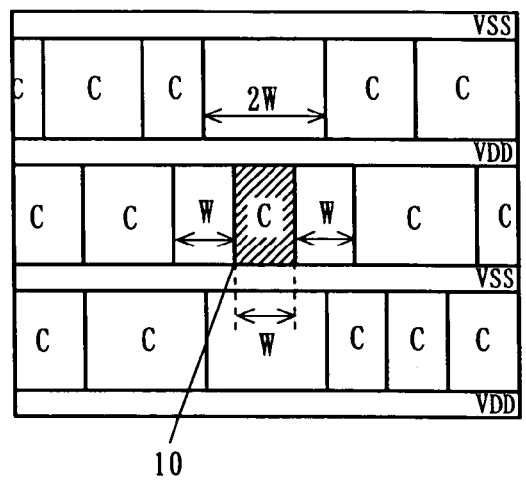

The layout results shown in FIG. 1 are obtained when the width A is W (the width of the cell 10) and the width B is 0. Alternatively, for example, when the width A is 2W and the width B is 0, layout results shown in FIG. 3A are obtained. When the widths A and B are both W, layout results shown in FIG. 3B are obtained. When the width A is 2W and the width B is W, layout results shown in FIG. 3C are obtained. In any of these layout results, no cell for performing a logical operation is placed in the cell-placement prohibiting area centering on the cell 10.

On the clock path of the semiconductor integrated circuit, a plurality of cells connected to each other in a predetermined format (hereinafter referred to as a cell group) may be included. A typical example of such a cell group is a delay cell group formed by connecting a plurality of delay cells in series (refer to FIGS. 4A and 4B, which will be described further below) For cell placement, a cell group is placed as a unit in a single strip area, and the cells included in the cell group are closely placed together in the single strip area. The reason for closely placing these cells included in the cell group together in the same strip area is to minimize an influence of delay in a wiring connecting among the cells upon a delay time of the cell group.

Also when the cell group is on the clock path, as with the layout results shown in FIGS. 1 and 3A through 3C, it is desirable that a cell-placement prohibiting area be set for each of the cells included in the cell group. However, as described above, these cells included in the cell group are closely placed in a single strip area, and therefore a cell-placement prohibiting area centering on each cell cannot be set. With this being the case, it is assumed herein that such a cell group on the clock path is regarded, in its entirety, as a single cell, and is treated in a manner similar to that for a single cell on the clock path.

Figure 4A:
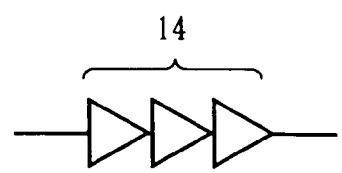
FIGS. 4A and 4B are illustrations each showing a delay cell group included in the semiconductor integrated circuit according to the first embodiment of the present invention.
Figure 4B:
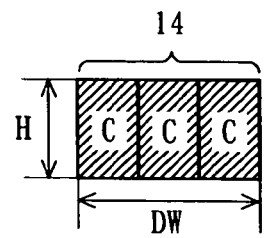

Hereinafter, the case is described in which a cell-placement prohibiting area is set for a delay cell group 14 (FIGS. 4A and 4B) placed on the clock path in the n-th strip area so as to center on the delay cell group 14. The delay cell group 14 is, as shown in FIG. 4A, a circuit in which a plurality of (three in FIGS. 4A and 4B) delay cells are connected in series. When the number of the delay cells included in the delay cell group 14 is D, the height of each delay cell is H, and the width thereof is W, the placed delay cell group 14 occupies a rectangular area having a height of H and a width of DW, as shown in FIG. 4B.

For the delay cell group 14, a cell-placement prohibiting is set so as to replace the cell 10 in the cell-placement prohibiting area 13 in FIGS. 2A and 2B. In other words, for the delay cell group 14, with its widths A and B being determined as appropriate, the cell-placement prohibiting area shown in FIG. 2A or 2B is set having a width of DW in place of the width of W.

Figure 5A:
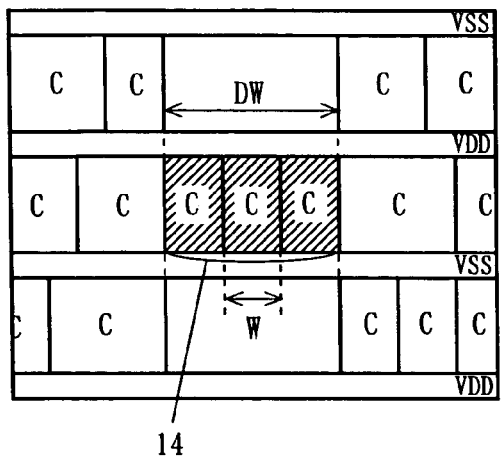
FIGS. 5A through 5E are illustrations showing other layout results of the semiconductor integrated circuit according to the first embodiment of the present invention.
Figure 5B:
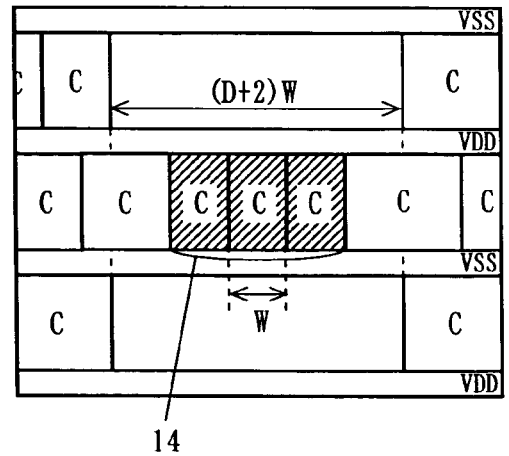
Figure 5C:
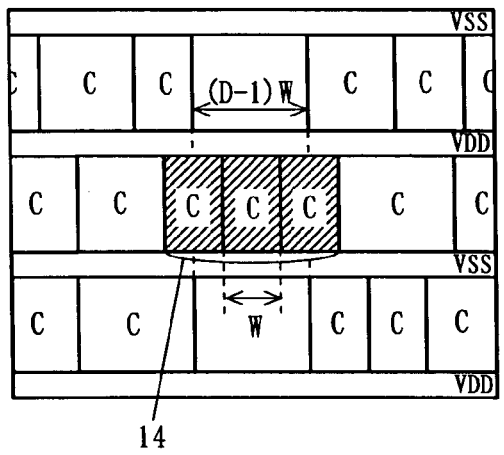
Figure 5D:
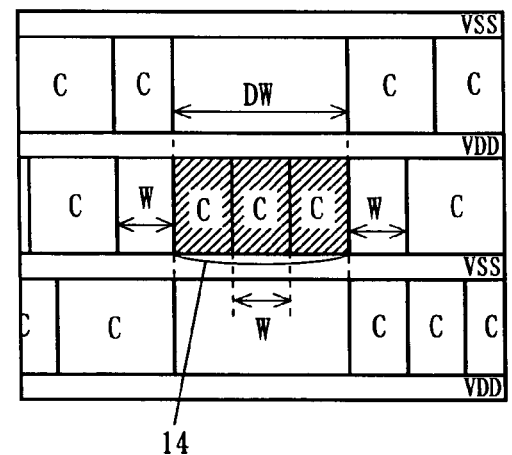
Figure 5E:
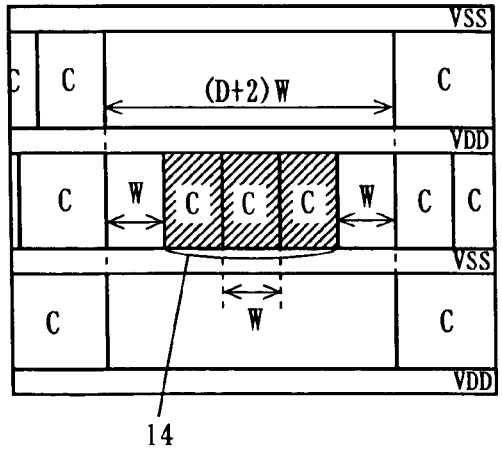

To set the cell-placement prohibiting area as described above for the delay cell group 14, when the width A is DW (the width of the entire delay cell group 14) and the width B is 0, layouts results shown in FIG. 5A are obtained. Also, when the width A is (D+2) W and the width B is 0, layouts results shown in FIG. 5B are obtained. Furthermore, when the width A is (D−1) W and the width B is 0, layouts results shown in FIG. 5C are obtained. Still further, when the width A is DW and the width B is W, layouts results shown in FIG. 5D are obtained. Still further, when the width A is (D+2) W and the width B is W, layouts results shown in FIG. 5E are obtained. In any of these layout results, no cell for performing a logical operation is placed in the cell-placement prohibiting area centering on the delay cell group 14.

Next, described is an effect obtained by not placing a cell for performing a logical operation near the cell (or the cell group) on the clock path as shown in FIGS. 1, 3A through 3C, and 5A through 5E. When the cell C for performing a logical operation is operated to change values of output signals of the cells, electric charge stored in the power-supply wiring near the cell C, a power-supply connecting section (VDD section and VSS section) inside the cell C, or the like is moved, thereby causing a current to flow from the power-supply wiring to the cell C. At this time, the amount of current flowing through the power-supply wiring is maximum at a point where the cell C is connected to the power-supply wiring (hereinafter, a power-supply point for the cell C). If the cell C for performing a logical operation and a cell C' on the clock path are placed so as to be opposed to each other over a power-supply wiring, the cell C' is susceptible to the influence of an IR-drop when the cell C is operated, because a power-supply point for the cell C is near a power-supply point for the cell C'. The same goes for the case where the cell C for performing a logical operation and the cell C' on the clock path are placed adjacently to each other in the same strip area.

Under such circumstances, to prevent the cell C' on the clock path from receiving the influence of an IR-drop, the power-supply point for the cell C' is sufficiently distanced away from the power-supply point for the cell C. In the semiconductor integrated circuit according to the present embodiment, no cell for performing a logical operation is placed near the cell on the clock path. Therefore, the power-supply point for the cell on the clock path is separated a predetermined distance away from the power-supply point for the cell for performing a logical operation. Thus, the cell on the clock path is insusceptible to the influence of an IR-drop occurring when the cell for performing a logical operation is operated. Therefore, according to the semiconductor integrated circuit of the present embodiment, it is possible to prevent an inconvenience such that the power-supply voltage at the cell on the clock path is dropped when another cell is operated and this drop causes a clock skew to result in a circuit malfunction.

In the semiconductor integrated circuit according to the present embodiment, what cell-placement prohibiting area is set for the cell (and the cell group) on the clock path is an issue. If the size of the cell-placement prohibiting area is larger, the effect of suppressing the occurrence of a clock skew due to an IR-drop can be increased, but the chip size is increased and the circuit manufacturing cost is increased accordingly. On the contrary, if the size of the cell-placement prohibiting area is too small, the above-mentioned effect cannot be sufficiently achieved. Therefore, the size and shape of the cell-placement prohibiting area set for the cell on the clock path have to be appropriately determined in consideration of a supply voltage in the circuit, a possible influence of an IR-drop, timing restrictions set in designing the circuit, etc. Also, to separate the power-supply point for the cell on the clock path away from the power-supply point for the cell for performing a logical operation, a cell-placement prohibiting area set for the cell placed on the clock path in the n-th strip area does not have to have an overlapping portion with a strip area including and before an (n−2)-th strip area and including and after an (n+2)-th strip area. In view of this, the cell-placement prohibiting areas shown in FIGS. 2A and 2B are devised.

Also, in the semiconductor integrated circuit according to the present embodiment, a cell-placement prohibiting area may be set for all of the cells (and the cell group) on the clock path. Alternatively, a cell-placement prohibiting area may be set for a part of the cells (and the cell group) on the clock path. To select cells to each of which a cell-placement prohibiting area is set from all of the cells on the clock path, a reference is set for cell selection. For example, from all of the cell on the clock path, cells whose delay time is equal to or longer than a predetermined threshold is selected, and a cell-placement prohibiting area is set only to the selected cells.

Next, two types of methods of designing the semiconductor integrated circuit according to the present invention are described. FIG. 6 is a flowchart showing a first method of designing the semiconductor integrated circuit according to the present invention. This first designing method is typically performed by using an Electronic Design Automation (EDA) system, which is an apparatus of designing a semiconductor integrated circuit.

In the method shown in FIG. 6, firstly, of the cells included in a circuit to be designed, cells on a clock path are placed (step S101). The positions where the cells on the clock path are placed are determined based on floor plan information of a clock circuit, etc., before the positions where other cells are placed. In more detail, in step S101, of all cells on the clock path, cells each of which a cell-placement prohibiting area is to be set for are selected, and then the selected cells are placed in a plurality of strip areas provided in parallel with each other in a two-dimensional area of a semiconductor integrated circuit so as to be aligned at top. In step S101, all or part of the cells on the clock path may be selected.

Next, a dummy cell larger than each cell is virtually placed at the position where each cell is placed in step S101 (step S102). The shape and size of the dummy cell to be placed in step S102 is made identical to the shape and size of the cell-placement prohibiting area centering on the cell.

Figure 8A:
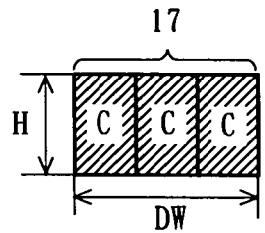
FIGS. 8A through 8C are illustrations each showing a dummy cell for use in the first method of designing the semiconductor integrated circuit according to the first embodiment of the present invention.
Figure 8B:
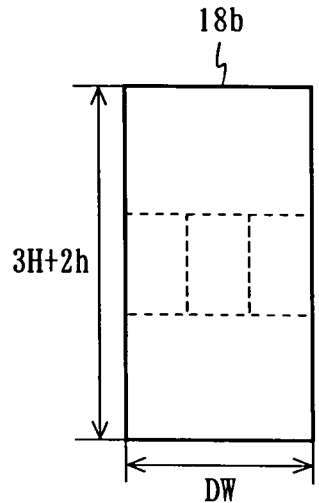
Figure 8C:
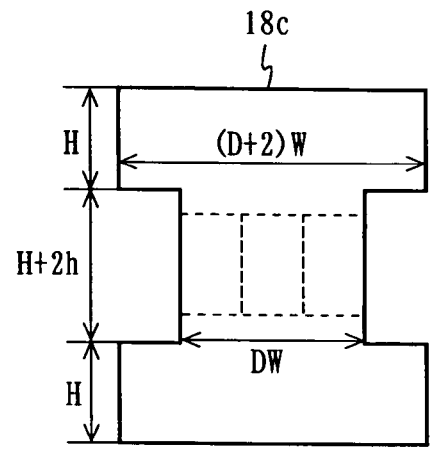

For example, consider the case where a cell-placement prohibiting area is set for a cell 15 having a height of H and a width of W shown in FIG. 7A with a manner similar to that in FIGS. 2A and 2B. In this case, if the width A is W (the width of the cell 15) and the width B is 0, a dummy cell 16b having a height of (3H+2h) and a width of W shown in FIG. 7B is set in step S102 at the position of the cell 15, where h is the width of the power-supply wiring. Also in this case, if the width A is 2W and the width B is 0, a dummy cell 16c having an H shape shown in FIG. 7C is set in step S102 at the position of the cell 15. Further, consider the case where a cell-placement prohibiting area is set for a delay cell group 17 formed of D delay cells each having a height of H and a width of W shown in FIG. 8A with a manner similar to that in FIGS. 2A and 2B. In this case, if the width A is DW (the width of the entire delay cell group 17) and the width B is 0, a dummy cell 18b having a height of (3H+2h) and a width of DW shown in FIG. 8B is set in step S102 at the position of the delay cell group 17. Also in this case, if the width A is (D+2) W and the width B is 0, a dummy cell 18c having an H shape shown in FIG. 8C is set in step S102 at the position of the delay cell group 17. The same goes for the case where a cell-placement prohibiting area having a shape other than the shapes mentioned above is set for a cell (or a cell group) on the clock path.

Next, of the cells included in the circuit to be designed, cells not placed in step S101 are placed (step S103). In step S103, no cell is placed in the area where the dummy cells have already been placed. Therefore, in step S103, the cells not yet placed are placed so as to be aligned at top in a portion of the plurality of strip areas where the cells were placed in step S101 except the areas where the dummy cells have been already placed. As such, according to the first designing method shown in FIG. 6, it is possible to design the semiconductor integrated circuit according to the present embodiment having a feature in which no cell for performing a logical operation is placed near the cell on the clock path.

Figure 9:
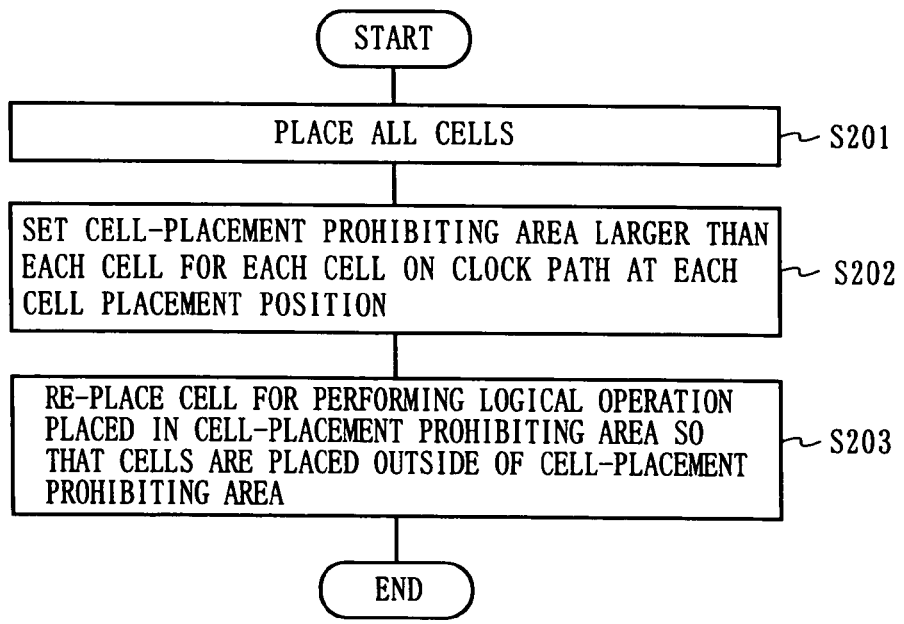
FIG. 9 is a flowchart showing a second method of designing the semiconductor integrated circuit according to the first embodiment of the present invention.

FIG. 9 is a flowchart showing a second method of designing the semiconductor integrated circuit according to the present embodiment. As with the first designing method (FIG. 6), this second designing method is typically performed by using an Electronic Design Automation (EDA) system.

In the method shown in FIG. 9, firstly, all cells included in a circuit to be designed are placed (step S201). In step S201, all cells included in the circuit to be designed are placed so as to be aligned at top in a plurality of strip areas provided in parallel with each other in a two-dimensional area.

Next, a cell-placement prohibiting area larger than each cell is set, for the cells on the clock path among the cells placed in step S201, at the position where each cell is placed (step S202). In more detail, in step S202, of all cells on the clock path, cells each of which a cell-placement prohibiting area is set for are selected, and the cell-placement prohibiting area 13 shown in FIGS. 2A and 2B, for example, is set for the selected cells. In step S202, all or part of the cells on the clock path may be selected.

Next, a cell for performing a logical operation placed in the cell-placement prohibiting area set in step S202 is re-placed so as to be placed outside of the cell-placement prohibiting area (step S203). In more detail, in step S203, a cell for performing a logical operation placed in the cell-placement prohibiting area is re-placed at a portion of the strip area where these cells are placed except the cell-placement prohibiting area. In step S203, only the cell placed in the cell-placement prohibiting area may be re-placed, or other cells may be also re-placed in accordance with re-placement of the cell placed in the cell-placement prohibiting area. As such, according to the second designing method shown in FIG. 9, it is possible to design the semiconductor integrated circuit according to the present embodiment having a feature in which no cell for performing a logical operation is placed near the cell on the clock path.

The first and second designing methods have the following effects. One of conventionally-known schemes for prohibiting cells included in the circuit to be designed from being placed in a specific area is a scheme of setting an area called a placement blockage. This placement blockage corresponds to the cell-placement prohibiting area in the semiconductor integrated circuit according to the present embodiment. In the conventional scheme, however, a placement blockage has to be set for each area where a cell is prohibited from being placed. On the other hand, in the first and second designing methods, a cell-placement prohibiting area is set at one time for all or part of the cells on the clock path. Therefore, according to the first and second designing methods, a placement blockage does not have to be set for each of the plurality of cells on the clock path, and it is possible to design the semiconductor integrated circuit according to the present embodiment having a feature in which no cell for performing a logical operation is placed near the cell on the clock path.

Here, the first and second designing methods can be used together with a method of prohibiting a cell from being placed in a specific area by using a placement blockage. That is, in the first and second designing methods, a placement blockage is previously set in an area where a cell is prohibited from being placed and then, at the time of cell placement, no cell is placed in the set placement blockage.

Second Embodiment

Figure 10:
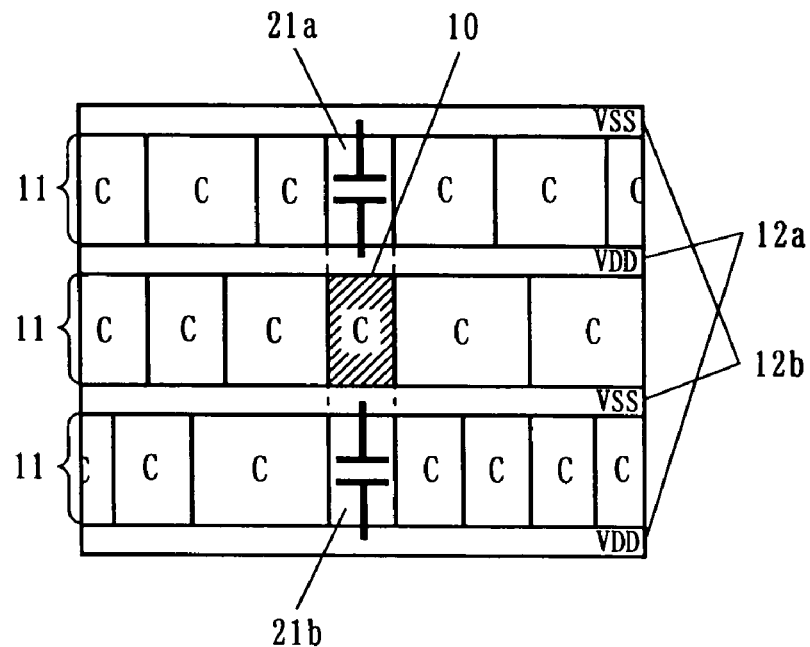
FIG. 10 is an illustration showing layout results of a semiconductor integrated circuit according to a second embodiment of the present invention.

In a second embodiment of the present invention, a semiconductor integrated circuit with the occurrence of a clock skew due to an IR-drop being suppressed and a method of designing such a semiconductor integrated circuit are described. FIG. 10 is an illustration showing layout results of the semiconductor integrated circuit according to the present embodiment. The semiconductor integrated circuit shown in FIG. 10 is similar to the semiconductor integrated circuit according to the first embodiment except that capacitive cells 21a and 21b being added thereto. Of the components according to the present embodiment, the components other than the capacitive cells 21a and 21b are identical to those according to the first embodiment, and therefore are provided with the same reference numerals and are not described herein.

In FIG. 10, the cell 10 is a cell of an arbitrary type on a clock path. For the cell 10, the cell-placement prohibiting area 13 shown in FIGS. 2A and 2B is set with its width A being W (the width of the cell 10) and its width B being 0. No cell for performing a logical operation is set in this cell-placement prohibiting area. Also, in the semiconductor integrated circuit according to the present embodiment, the capacitive cells 21a and 21b are placed in the cell-placement prohibiting area. In more detail, when a cell-placement prohibiting area is set for the cell 10 placed on the clock path in the n-th strip area 11 so as to center on the cell 10, the capacitive cell 21a is placed at the same cell-width position as that of the cell 10 in the (n−1)-th strip area 11. Also, the capacitive cell 21b is placed at the same cell-width position as that of the cell 10 in the (n+1)-th strip area 11. The capacitive cell 21a is connected to the power-supply wirings 12a and 12b sandwiching the capacitive cell 21a. Similarly, the capacitive cell 21b is connected to the power-supply wirings.

The semiconductor integrated circuit according to the present embodiment has a feature in which, in addition to the cell-placement prohibiting area is set centering on the cell on the clock path, the capacitive cells 21a and 21b are placed in the cell-placement prohibiting area. One end of each of the capacitive cells 21a and 21b is connected to each relevant power-supply wiring 12a applied with the power-supply voltage VDD. The other end of each of the capacitive cells 21a and 21b is connected to each relevant power-supply wiring 12b applied with the ground voltage VSS. The capacitive cells 21a and 21b have a function of stabilizing the power supplied via the power-supply wirings 12a and 12b. As such, according to the semiconductor integrated circuit of the present embodiment, with the capacitive cells being provided in the cell-placement prohibiting area, the power supplied via the power-supply wiring is stabilized. Therefore, it is possible to more effectively prevent an inconvenience such that a clock skew occurs due to an IR-drop to result in a circuit malfunction.

In the above description, an example of the semiconductor integrated circuit according to the present embodiment is described in which the cell-placement prohibiting area 13 shown FIGS. 2A and 2B with its width A being W (the width of the cell 10) and its width B being 0 is set for the cell 10 on the clock path. Alternatively, a cell-placement prohibiting area having a shape and a size other than those described above may be set for the cell 10 on the clock path. Still alternatively, a cell-placement prohibiting area may be set for each of the cell groups on the clock path. Still alternatively, as with the first embodiment, a cell-placement prohibiting area may be set for all or part of the cells (or the cell group) on the clock path.

Figure 11:
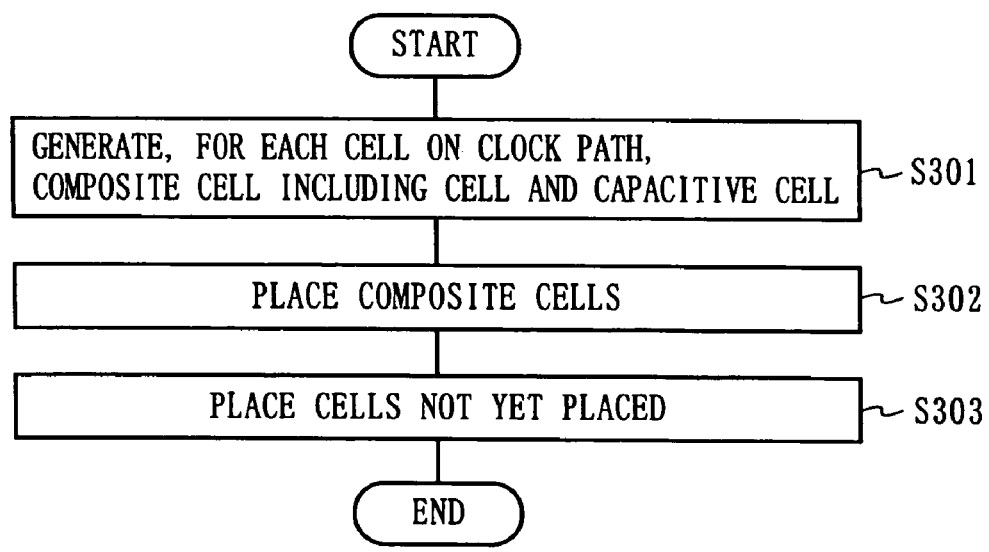
FIG. 11 is a flowchart showing a method of designing the semiconductor integrated circuit according to the second embodiment of the present invention.

Next, a method of designing the semiconductor integrated circuit according to the present embodiment is described. FIG. 11 is a flowchart showing the method of designing the semiconductor integrated circuit according to the present embodiment. As with the designing method shown in the first embodiment, the designing method shown in FIG. 11 is typically performed by using an EDA system.

In the method shown in FIG. 11, firstly, for each cell on the clock path included in a circuit to be designed, a composite cell including the cell and capacitive cells is generated (step S301). In step S301, a composite cell may be generated for each of all or part of the cells on the clock path.

For example, consider the case where a cell-placement prohibiting area is set for a cell 22 having a height of H and a width of W shown in FIG. 12A with a manner similar to that in FIGS. 2A and 2B. In this case, if the width A is W (the width of the cell 22) and the width B is 0, a composite cell 25b having a height of (3H+2h) and a width of W shown in FIG. 12B is generated in step S301. The composite cell 25b includes the cell 22 and capacitive cells 23a and 23b. Inside the composite cell 25b, the cell 22 and the capacitive cells 23a and 23b are placed so as to be aligned in line at the same cell-width position. Also consider the case where a cell-placement prohibiting area is set for a delay cell group 24 formed of D delay cells each having a height of H and a width of W shown in FIG. 12C with a manner similar to that in FIGS. 2A and 2B. In this case, if the width A is (D+2) W and the width B is 0, a composite cell 25d having an H shape is generated in step S301. The composite cell 25d includes the delay cell group 24 and capacitive cells 23c and 23d. Inside the composite cell 25d, the delay cell group 24 and the capacitive cells 23c and 23d are placed so as to be aligned in line at the same cell-width position. The same goes for the case where a cell-placement prohibiting area having a shape other than that described above is set for the cell (or the cell group) on the clock path.

Next, the composite cells generated in step S301 are placed (step S302). In step S301, the cells included in the composite cell are placed in a plurality of strip areas provided in parallel with each other so as to be aligned at top. With this, layout results can be obtained in which the cells on the clock path and the capacitive cells are placed.

Next, of the cells included in the circuit to be designed, cells not placed in step S302 are placed (step S303). In step S303, no cell is placed in the area where the composite cells have already been placed. Therefore, in step S303, the cells not yet placed are placed so as to be aligned at top in a portion of the plurality of strip areas where the composite cells were placed in step S302, except the areas where the composite cells have been already placed. As such, according to the designing method shown in FIG. 11, it is possible to design the semiconductor integrated circuit according to the present embodiment having a feature in which not a cell for performing a logical operation but capacitive cells are placed near the cell on the clock path.

Also, in the designing method shown in FIG. 11, a cell-placement prohibiting area are placed at one time for all or part of the cells on the clock path, and capacitive cells are also placed for all or part of the cells on the clock path. Therefore, according to the designing method shown in FIG. 11, a placement blockage does not have to be set for each of the plurality of cells on the clock path with capacitive cells being further placed, and it is possible to design the semiconductor integrated circuit according to the present embodiment having a feature in which not a cell for performing a logical operation but capacitive cells are placed near the cell on the clock path.

Third Embodiment

In a third embodiment of the present invention, a method of designing a semiconductor integrated circuit with the occurrence of a clock skew due to an IR-drop being suppressed is described. FIG. 13 is a flowchart showing the method of designing the semiconductor integrated circuit according to the present embodiment. As with the designing methods described in the first and second embodiments, the designing method shown in FIG. 13 is typically performed by using an EDA system.

Figure 19:
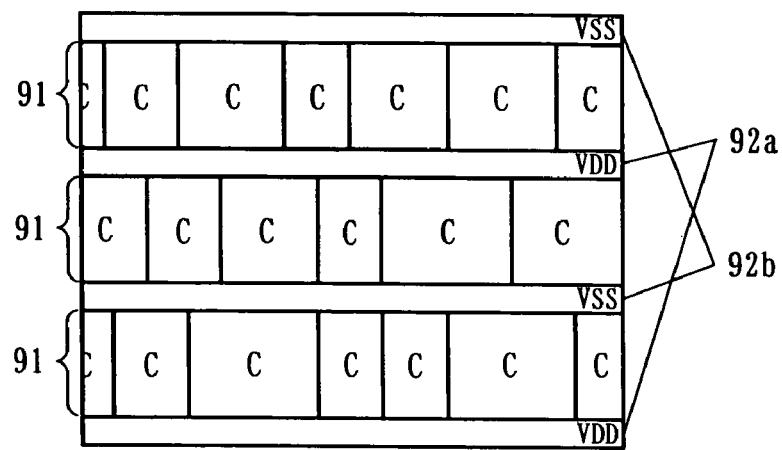
FIG. 19 is an illustration showing layout results of a conventional semiconductor integrated circuit.

In the method shown in FIG. 13, firstly, all cells included in a circuit to be designed are placed (step S401). With step S401 being performed, layout results shown in FIG. 19 are obtained, for example. Next, an IR-drop amount is calculated for each cell on the clock path among the cells included in the circuit to be designed (step S402). Here, the IR-drop amount is an amount of drop in power-supply voltage supplied from the outside of the semiconductor integrated circuit to the cell, the drop being caused by resistance of the power-supply wiring. The IR-drop amount can be calculated based on the layout results of the semiconductor integrated circuit. Here, in step S402, the IR-drop amount may be calculated for all or part of the cells on the clock path.

Next, it is determined whether each calculated IR-drop amount is not more than a predetermined allowable value (step S403). If it is determined in step S403 that each calculated IR-drop amount is equal to or less than a predetermined allowable value, (YES in step S403), the procedure ends. Otherwise (NO in step S403), the procedure goes to step S404. In this case, when a cell whose IR-drop amount exceeds the allowable value is a cell Cx, a cell placed closest to the cell Cx is re-placed so as to be placed away from the cell Cx (step S404). Next, the procedure goes to step S402. With this, until it is determined in step S403 that each calculated IR-drop amount is not more than the allowable value, three steps of cell replacement, calculation of an IR-drop amount, and then determination as to the IR-drop amount are repeatedly performed.

In step S404, when the IR-drop amount of the cell Cx exceeds the allowable value, the cell placed closest to the cell Cx is re-placed so as to be away from the cell Cx. In general, in this cell re-placing step, a cell placed near the cell Cx may be re-replaced so as to be away from the cell Cx. For example, in this cell re-placing step, a cell having the most influence on the IR-drop amount of the cell Cx may be detected for re-placement so as to be away from the cell Cx.

Figure 14A:
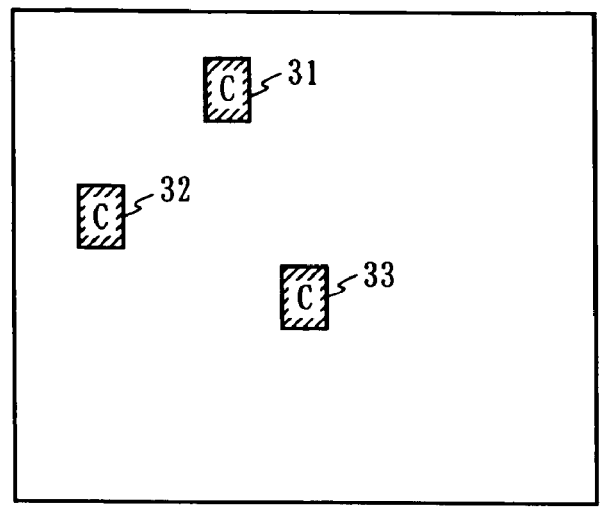
FIGS. 14A through 14C are illustrations showing an example of performing the method of designing the semiconductor integrated circuit according to the third embodiment of the present invention.
Figure 14B:
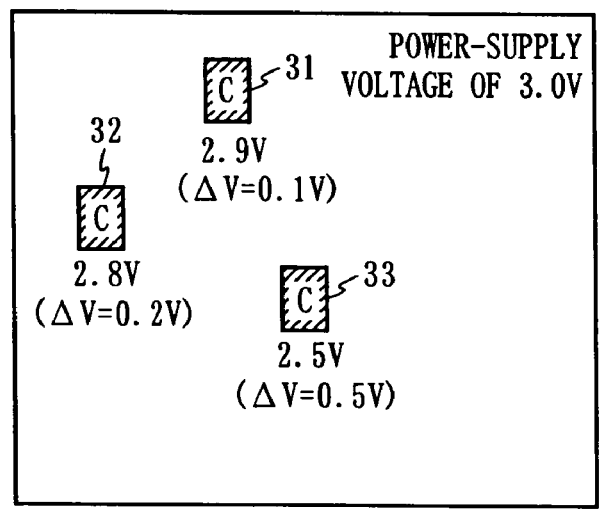
Figure 14C:
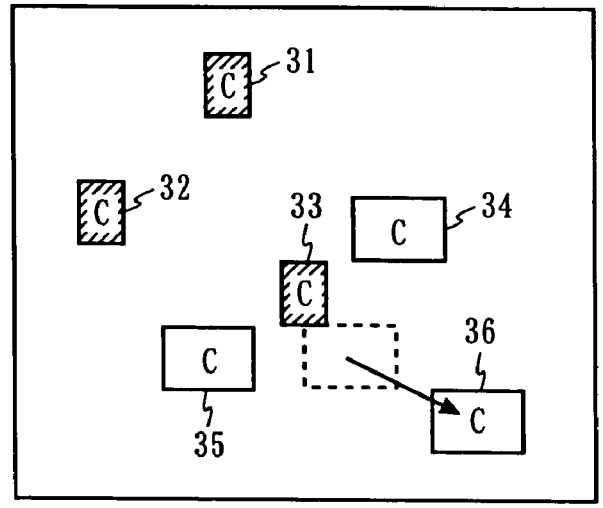

With reference to FIGS. 14A through 14C, an example of how the method of designing the semiconductor integrated circuit according to the present embodiment is performed is described. For example, it is assumed that layout results are obtained as a result of performing step S401 on the circuit to be designed. In FIG. 14A, cells 31, 32, and 33 are cells of an arbitrary type on the clock path. Next, in step S402, based on the circuit layout results, an IR-drop amount is calculated for each of the cells 31, 32, and 33. For example, it is assumed that with a power-supply voltage of 3.0V being supplied to the circuit, power-supply voltages at the cells 31, 32, and 33 are 2.9V, 2.8V, and 2.5V, respectively. In this case, IR-drop amounts ΔV of the cells 31, 32, and 33 are 0.1V, 0.2V, and 0.5V, respectively (refer to FIG. 14B).

Next, it is determined in step S403 whether each of the IR-drop amounts ΔV of the cells 31, 32, and 33 is not more than a predetermined allowable value. For example, when the allowable value of the IR-drop amount is 0.3V, it is determined that the IR-drop amount of the cell 33 exceeds the allowable value. Then, in step S404, of cells 34, 35, and 36 placed near the cell 33, the cell 36, which is placed closest to the cell 33, is selected. Then, the cell 36 is re-placed so as to be away from the cell 33, as shown in FIG. 14C. In FIG. 14C, a position of the cell 36 before re-placement is represented by a dotted line, while a position of the cell 36 after re-placement is represented by a solid line.

As described above, in the method of designing the semiconductor integrated circuit according to the present embodiment, when the IR-drop amount of a cell on the clock path exceeds an allowable value, a cell placed near the cell on the clock path is re-placed so as to be away from the cell on the clock path until the IR-drop amount is not more than the allowable value. Therefore, according to the designing method of the present embodiment, it is possible to design a semiconductor integrated circuit with the occurrence of a clock skew due to an IR-drop being suppressed without moving a cell on the clock path.

Fourth Embodiment

Figure 15:
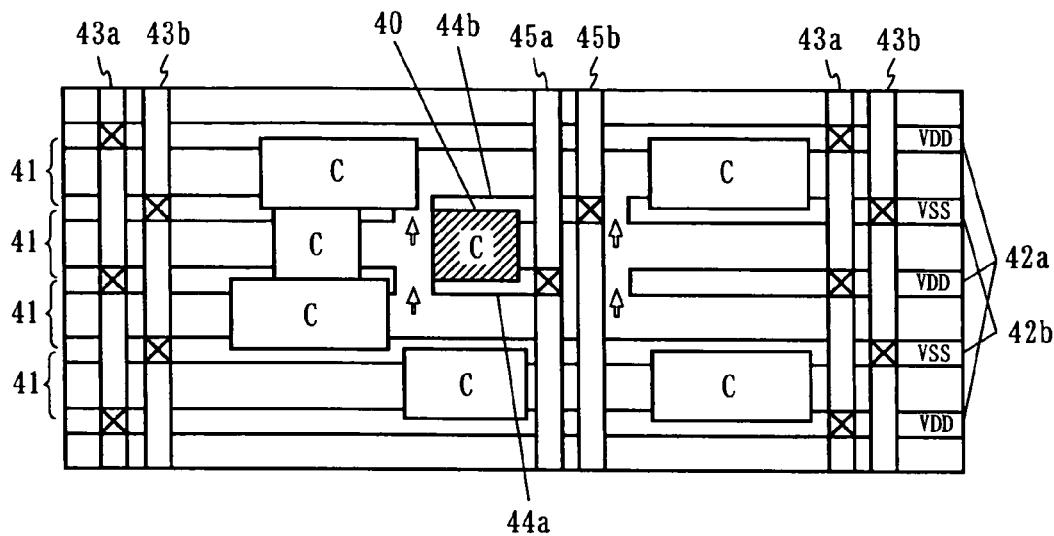
FIG. 15 is an illustration showing layout results of a semiconductor integrated circuit according to a fourth embodiment of the present invention.

In a fourth embodiment, a semiconductor integrated circuit with the occurrence of a clock skew due to an IR-drop being suppressed is described. FIG. 15 is an illustration showing layout results of the semiconductor integrated circuit according to the present embodiment. The semiconductor integrated circuit shown in FIG. 15 includes a plurality of cells (rectangular areas with characters C) and wirings connecting among the cells. Note that, in FIG. 15, for simplification of the drawing, wirings other than power-supply wiring for connecting among the cells are not shown.

The semiconductor integrated circuit according to the present embodiment is similar to that according to the first embodiment in that cells shown in FIG. 15 are standard cells, the cells are placed so as to be aligned at top in a plurality of strip areas 41, and power-supply wirings 42a and 42b are provided in a two-dimensional area where the strip areas 41 are arranged. The power-supply wirings 42a and 42b are connected via contacts (in FIG. 15, rectangles with "x" marks) to power-supply wirings 43a and 43b extending in a cell's height direction. The power-supply wirings 42a and 43a are applied with the power-supply voltage VDD, while the power-supply wirings 42b and 43b are applied with the ground voltage VDD. As such, the power-supply voltage supplied from the outside of the semiconductor integrated circuit are supplied via the power-supply wirings 42a, 42b, 43a, and 43b to each cell except a cell 40.

In FIG. 15, a cell 40 is a cell of an arbitrary type on the clock path. As described in the first embodiment, the cell on the clock path is required to be more insusceptible to the influence of an IR-drop than other cells. Therefore, the semiconductor integrated circuit according to the present embodiment has a feature in which a power-supply wiring dedicated for supplying power to the cell 40 is provided.

To achieve this, the semiconductor integrated circuit according to the present embodiment includes clock-specific power-supply wirings 45a and 45b. These clock-specific power-supply wirings 45a and 45b are wirings extending in a cell's height direction, and are provided near the cell 40. The power-supply wirings 42a and 42b sandwiching the cell 40 are cut out at four points near the cell 40 (points denoted by arrows in FIG. 15) so that the cell 40 is separated from the power-supply wirings 42a and 42b. With this, power-supply wirings 44a and 44b are formed, which are relatively short with both ends being cut out. The cell 40 is connected to the power-supply wirings 44a and 44b, and the power-supply wirings 44a and 44b are connected via contacts to the clock-specific power-supply wirings 45a and 45b. In this manner, a power-supply voltage supplied from the outside of the semiconductor integrated circuit is supplied via the clock-specific power-supply wirings 45a and 45b and the power-supply wirings 44a and 44b.

In brief, the semiconductor integrated circuit according to the present embodiment includes first power-supply wirings 44a, 44b, 45a, and 45b for supplying power to the cell 40 on the clock path and second power-supply wirings 42a, 42b, 43a, and 43b for supplying power to the cells other than the cell 40. Also, the first power-supply wirings are provided separately from the second power-supply wirings in order to supply power to the cell 40. For example, the first and second power-supply wirings may be connected to each different power-supply terminal, and these power-supply wirings of two types may not be connected to each other inside of the semiconductor integrated circuit. Alternatively, the first and second power-supply wirings may not be connected in the two dimensional area where the cells are placed, but may be connected outside of the two dimensional area where the cells are placed.

In the conventional semiconductor integrated circuit (FIG. 19), all cells are supplied with power from the same power-supply wirings. Therefore, if a cell other than the cells on the clock path is operated, a current flows through the power-supply wiring to drop the power-supply voltage to be supplied to the cells on the clock path, thereby resulting in a clock skew. Such an occurrence of a clock skew may causes a circuit malfunction.

On the other hand, the semiconductor integrated circuit according to the present embodiment includes power-supply wirings dedicated for supplying power to the cells on the clock path, and no other cells are connected to these power-supply wirings. Therefore, even if a cell other than the cells on the clock path is operated, such an operation does not influence the dedicated power-supply wirings. Thus, the occurrence of a clock skew due to an IR-drop can be suppressed.

In the above description, by way of example, power-supply wirings dedicated for supplying power to the cell 40 on the clock path are provided. However, the clock path incorporated in the semiconductor integrated circuit generally includes many cells. Therefore, in a general semiconductor integrated circuit, a dedicated power-supply wirings are provided to not all of the cells on the clock path but part of the cells on the clock path.

Figure 16A:
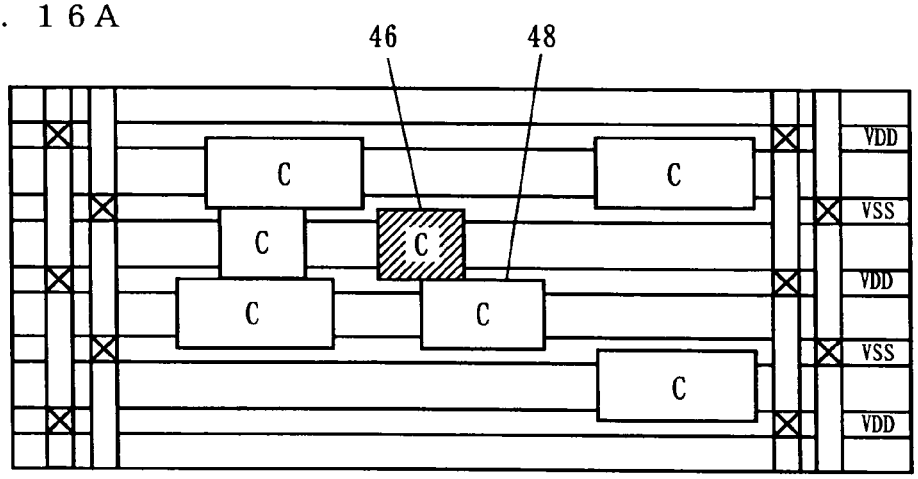
FIGS. 16A and 16B are illustrations showing how cells are re-placed in order to obtain the semiconductor integrated circuit according to the fourth embodiment of the present invention.
Figure 16B:
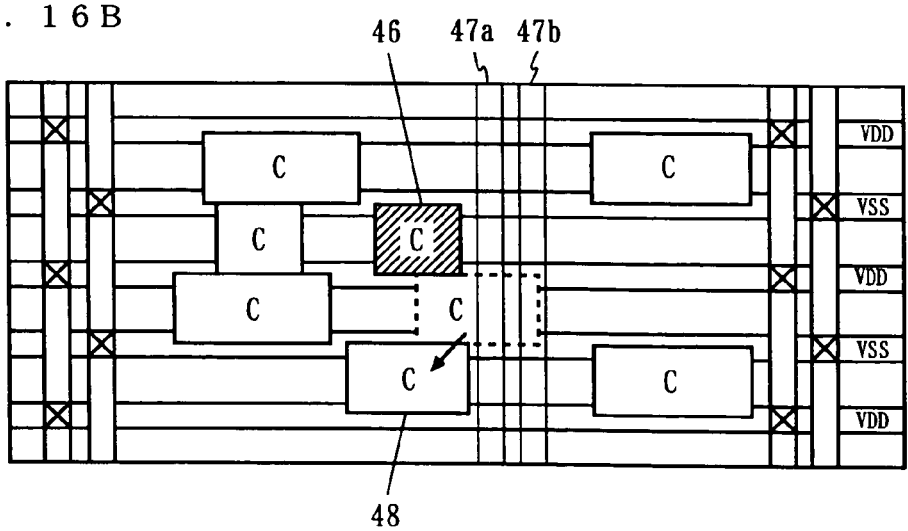

Also, in the case where the dedicated power-supply wirings are provided after all cells are placed, if a cell has been placed at a position where the dedicated power-supply wiring is to be provided, an Engineering Change Order (ECO) process (a process of individually re-placing the placed cells) may be performed, for example, to re-place the cell. For example, when clock-specific power-supply wirings 47a and 47b are provided near a cell 46 on the clock path (in FIG. 16A, to immediate right of the cell 46) after the layout results shown in FIG. 16A are obtained, a cell 48 will be an obstacle. In this case, as shown in FIG. 16B, the cell 48 is re-placed so as not to obstruct the clock-specific power-supply wirings 47a and 47b. In FIG. 16B, the position of the cell 48 before re-placement is represented by a dotted line, while the position of the cell 48 after replacement is represented by a solid line.

Fifth Embodiment

Figure 17:
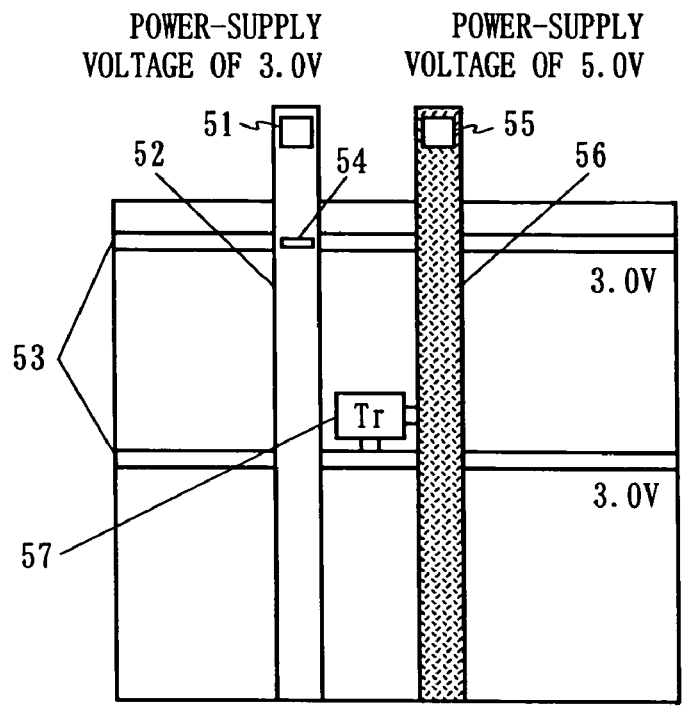
FIG. 17 is a schematic illustration showing a method of supplying power voltage in a semiconductor integrated circuit according to a fifth embodiment of the present invention.

In a fifth embodiment, a semiconductor integrated circuit with the occurrence of a clock skew due to an IR-drop being suppressed is described. FIG. 17 is an illustration showing a power supplying method according to the present embodiment. The semiconductor integrated circuit shown in FIG. 17 includes a plurality of cells (not shown), wirings connecting among the cells (not shown), a power-supply terminal, a power-supply wiring 52 extending in a predetermined direction (in FIG. 17, in a portrait direction), and power-supply wirings 53 extending in a direction perpendicular to the power-supply wiring 52 (in FIG. 17, in a landscape direction). The power-supply terminal 51 is connected to the power-supply wiring 52. The power-supply wiring 52 is connected via a contact 54 to the power-supply wiring 53. The power-supply wiring 53 is connected to a cell not shown. The power-supply terminal 51 is applied with a power-supply voltage of, for example, 3.0V. With this, the cells included in the semiconductor integrated circuit are supplied with the power-supply voltage of 3.0V.

Also, the semiconductor integrated circuit shown in FIG. 17 includes, in addition to the above-described components, a power-supply terminal 55, an additional power-supply wiring 56 extending in parallel with the power-supply wiring 52, and a power transistor 57. The power-supply terminal 55 is connected to the additional power-supply wiring 56. The additional power-supply wiring 56 is connected to the power-supply wiring 53 via the power transistor 57. The power-supply terminal 55 is applied with a power-supply voltage higher than the power-supply voltage applied to the power-supply terminal 51, for example, 5.0V.

Figure 18:
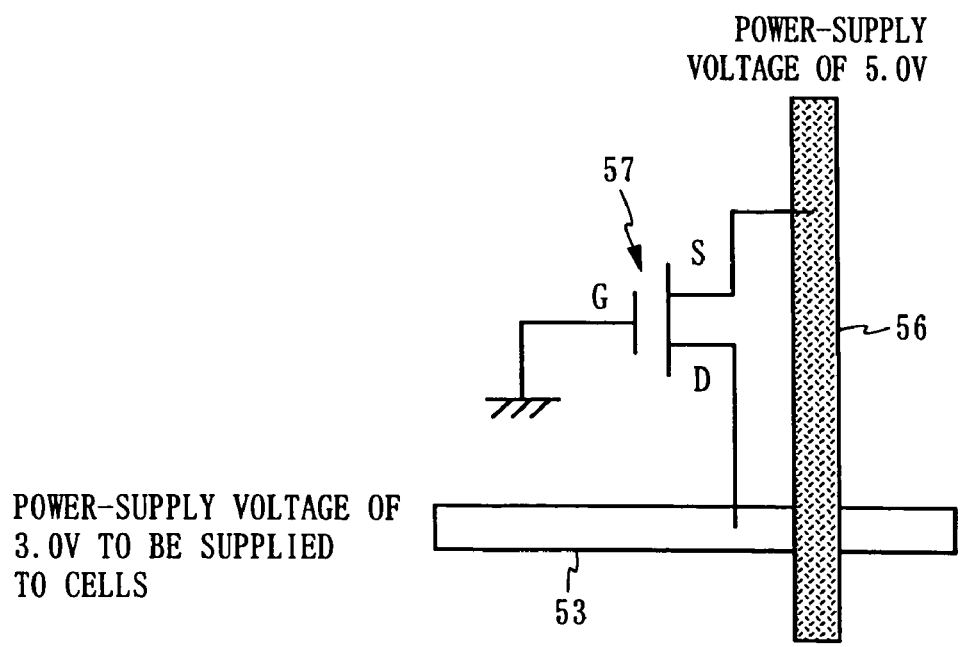
FIG. 18 is an illustration showing a power transistor included in the semiconductor integrated circuit according to the fifth embodiment of the present invention.

FIG. 18 is an illustration showing details of the power transistor 57. As shown in FIG. 18, the power transistor 57 has a source terminal, a gate terminal, and a drain terminal. The source terminal of the power transistor 57 is connected to the additional power-supply wiring 56. The gate terminal is grounded. The drain terminal is connected to the power-supply wiring 53. The gate-grounded power transistor 57 as described above functions as a level shift circuit for dropping the power-supply voltage of 5.0V on the additional power-supply wiring 56 connected to the source terminal to a voltage of 3.0V to be supplied to the cell, thereby applying the voltage to the power-supply wiring 53 connected to the drain terminal.

Figure 20:
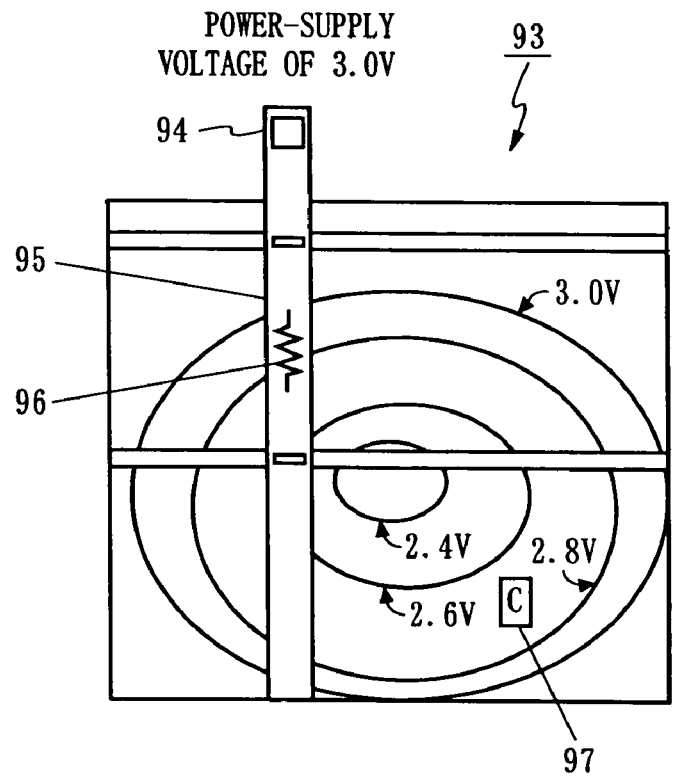
FIG. 20 is an illustration showing a state where IR-drop occurs in the conventional semiconductor integrated circuit.

In the conventional semiconductor integrated circuit, as shown in FIG. 20, a large IR-drop occurs at the center of the chip. To ensure that even the occurrence of an IR-drop does not cause the circuit to malfunction, a method has been adopted in which the circuit is designed with design margins being set in consideration of an IR-drop.

Also, in order to eliminate the influence of the IR-drop occurring at the center of the chip, a method of directly adding a power-supply wiring to the center of the chip (bypass method) is conventionally known. However, the added power-supply wiring also includes a resistance component. Therefore, even with such a bypass method, a power-supply voltage supplied to each cell via the added power-supply wiring is also dropped. Thus, applying a power-supply voltage at a level equal to that of the original power-supply wiring to the added power-supply wiring, an effect of suppressing the IR-drop occurring at the center of the chip is limited.

On the other hand, in the semiconductor integrated circuit according to the present embodiment, a power-supply voltage at a level higher than that of the original power-supply wiring is applied to the added power-supply wiring. With the operation of the power transistor, the power-supply voltage applied to the added power-supply wiring is dropped to the power-supply voltage to be supplied to each cell. Therefore, according to the semiconductor integrated circuit of the present embodiment, the IR-drop occurring at the center of the chip can be effectively suppressed. Accordingly, the occurrence of a clock skew due to the IR-drop can be suppressed.

In the above description, the semiconductor integrated circuit includes one power-supply terminal 55, one additional power-supply wiring 56, and one power transistor. Alternatively, a plurality of such components may be provided.

The semiconductor integrated circuit and the semiconductor-integrated-circuit designing method of the present invention have an effect of preventing the occurrence of a clock skew due to an IR-drop. Therefore, the present invention can be utilized for various semiconductor integrated circuits, such as a semiconductor integrated circuit designed in a cell-based scheme and a semiconductor integrated circuit partially designed in a cell-based scheme.

While the invention has been described in detail, the foregoing description is in all aspects illustrative and not restrictive. It is understood that numerous other modifications and variations can be devised without departing from the scope of the invention.

What is claimed is:

1. A semiconductor integrated circuit designed in a cell-based scheme, comprising:
    a plurality of cells placed so as to be aligned at top in a plurality of strip areas provided in parallel with each other; and
    a plurality of wirings connecting among the cells, wherein the cells include cells on a clock path and a cell for performing a logical operation, and a cell-placement prohibiting area is set for each of all or part of the cells on the clock path so as to center on the cell on the clock path, and
    the cell for performing the logical operation is placed in a portion of the strip areas except the cell-placement prohibiting areas,
    wherein a capacitive cell is placed in at least one of the cell-placement prohibiting areas,
    wherein a cell-placement prohibiting area placed so as to center on a cell in an n-th strip area forms an overlapping area with an (n−1)-th strip area and an (n+1)-th strip area, and
    wherein the capacitive cell is placed in the overlapping area.

2. The semiconductor integrated circuit according to claim 1, wherein
    a cell-placement prohibiting area placed so as to center on a cell in an n-th (n is an integer) strip area overlaps with an (n−1)-th strip area and an (n+1)-th strip area by a width not shorter than a width of each cell.

3. The semiconductor integrated circuit according to claim 1, wherein
    a cell-placement prohibiting area placed so as to center on a cell in an n-th strip area overlaps with the n-th strip area by a width not shorter than three times as long as a width of the cell.

4. The semiconductor integrated circuit according to claim 1, wherein
    cell groups each formed of a plurality of cells closely placed together in a single strip area include cell groups on the clock path, and a cell-placement prohibiting area is set for all or part of the cell groups on the clock path.

5. A method of designing a semiconductor integrated circuit in a cell-based scheme, comprising the steps of:
    generating, for each of all or part of cells on a clock path which are included in a circuit to be designed, a composite cell including the cell and the capacitive cell;
    placing the composite cells so that the composite cells are placed in a plurality of strip areas provided in parallel with each other so as to be aligned at top; and
    placing cells not yet placed, which are included in the circuit to be designed, in a portion of the strip areas except an area where the composite cell is placed so that the cells not yet placed are aligned at top wherein a capacitive cell is placed in at least one of the cell-placement prohibiting areas, wherein a cell-placement prohibiting area placed so as to center on a cell in an n-th strip area forms an overlapping area with an (n−1)-th strip area and an (n+1)-th strip area, and wherein the capacitive cell is placed in the overlapping area.

6. The semiconductor-integrated-circuit designing method according to claim 5, wherein
    in the step of generating the composite cell, each of all or part of cell groups each formed of a plurality of cells on the clock path includes a capacitive cell, and the composite cell is generated so that the cells included in each of the cell groups are closely placed together in a single strip area.

* * * * *